(12) United States Patent
Song

(10) Patent No.: US 6,191,049 B1
(45) Date of Patent: Feb. 20, 2001

(54) METHOD FOR FORMING OXIDE FILM IN SEMICONDUCTOR DEVICE

(75) Inventor: Du Heon Song, Kyungki-do (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/208,042

(22) Filed: Dec. 9, 1998

(30) Foreign Application Priority Data

Dec. 31, 1997 (KR) .................................................. 97-80699

(51) Int. Cl.$^7$ ........................ H01L 21/31; H01L 21/469
(52) U.S. Cl. ............................................. 438/758; 438/766
(58) Field of Search .................................... 438/703, 758, 438/765, 766, 770, 763, 981

(56) References Cited

U.S. PATENT DOCUMENTS

| | | | |
|---|---|---|---|
| 4,302,766 | * 11/1981 | Guterman et al. | 357/41 |
| 4,420,871 | * 12/1983 | Scheibe | 29/571 |
| 4,642,881 | * 2/1987 | Matsukawa et al. | 29/576 B |
| 4,774,197 | * 9/1988 | Haddad et al. | 437/27 |
| 4,776,925 | * 10/1988 | Fossum et al. | 156/653 |
| 4,945,068 | 7/1990 | Sugaya | 437/52 |
| 5,330,920 | 7/1994 | Soleimani et al. | 437/24 |
| 5,429,972 | * 7/1995 | Anjum et al. | 437/47 |
| 5,672,521 | * 9/1997 | Barsan et al. | 437/24 |
| 5,918,133 | * 6/1999 | Gardner et al. | 438/299 |

* cited by examiner

*Primary Examiner*—John F. Niebling
*Assistant Examiner*—Walter L. Lindsay, Jr.
(74) *Attorney, Agent, or Firm*—Fleshner & Kim, LLP

(57) ABSTRACT

Method for forming an oxide film in a semiconductor device, is disclosed, which is suitable to form oxide films of different thicknesses in a device region, to which driving voltages of different levels are applied respectively, including the steps of providing a semiconductor substrate, forming an insulating film on the semiconductor substrate, injecting first, and second impurity ions into the semiconductor substrate through the exposed insulating film after masking required regions of the insulating film, removing the insulating film, and forming first, and second oxide films having thicknesses different from each other on regions of the semiconductor substrate having the impurity ions are injected and the impurity ions are not injected thereto, respectively.

19 Claims, 7 Drawing Sheets

METHOD FOR FORMING OXIDE FILM IN SEMICONDUCTOR DEVICE

BACKGROUND OF THE INVENTION

1. Field of the Invention

The present invention relates to a method for forming an oxide film in a semiconductor device, and more particularly, to a method for forming an oxide film in a semiconductor device which is suitable to form oxide films of different thicknesses in a device region, to which driving voltages of different levels are applied respectively.

2. Discussion of the Related Art

In general, an embedded DRAM, or a semiconductor device with different driving voltages requires oxide films having thicknesses different from each other. Of the DRAMs and logic devices respectively developing rapidly as integration of semiconductor devices advances, with emerging of the embedded DRAM which is a combination of the DRAM and logic device, which trend is expected to be continuous in the future, regions with different driving voltages requires oxide films with thicknesses different from each other, such as memory cell regions, core and peripheral regions in the DRAM, regions of the logic device excluding input/output regions of the logic device, input/output buffer regions of the logic device and ESD (Electro Static Discharge) regions of the DRAM and the logic device. The oxide films with different thicknesses in a semiconductor device may be formed by wet etching or by ion injection. However, because the above two methods have problems in view of uniformity of the thickness and reliability of the oxide films, various researches for solving such problems are underway, actively.

A background art method for forming an oxide film in a semiconductor device will be explained with reference to the attached drawings. FIGS. 1a~1e illustrate sections showing process steps of a background art method for forming an oxide film in a semiconductor device.

Referring to FIG. 1a, a sacrificial oxide film 2 is formed on a semiconductor substrate 1 in regions defined as a first region A a thick oxide film to be formed thereon and as a second region B a thin oxide film to be formed thereon, respectively. As shown in FIG. 1b, a photoresist film PR is coated on the sacrificial oxide film 2 and subjected to patterning by exposure and development to leave the photoresist film PR only on the semiconductor substrate in the first region A. As shown in FIG. 1c, nitrogen ions 3 are injected into the semiconductor substrate 1 in the second region B using the photoresist film PR as a mask and subjected to annealing, to diffuse the nitrogen ions 3. As shown in FIG. 1d, the photoresist film PR and the sacrificial film 2 are removed. As shown in FIG. 1e, the entire surface of the semiconductor substrate 1 is subjected to annealing, to grow a thick first gate oxide film 4 on the semiconductor substrate 1 in the first region A and a thin second gate oxide film 5 on the semiconductor substrate 1 in the second region B. That is, because of the slow growth of the gate oxide film in the portion of the semiconductor substrate 1 into which the nitrogen ions are injected than the portion of the semiconductor substrate 1 into which no nitrogen ions are injected due to suppression of oxidation at a surface of the semiconductor substrate by the nitrogen ions, a dual gate oxide film is formed, in which the first, and second oxide films 4 and 5 have different thicknesses. And, though not shown in the drawings, a fluorine ion injection instead of the nitrogen ion injection will cause a result opposite to the aforementioned result. That is, the fluorine ion activates oxidation at the surface of the semiconductor substrate, to form an oxide film thicker than other region to which the fluorine ion is not injected. In the background art, either nitrogen or fluorine ions are injected into a semiconductor substrate in formation of the dual gate oxide film.

However, the background art method for forming an oxide film has the following problems.

First, the thin gate oxide film by nitrogen ion injection has a low reliability as a gate oxide film due to a poor TDDB (Time Dependent Dielectric Breakdown) characteristic.

Second, in the case of a gate electrode with a dual polygate on a thick gate oxide film by fluorine injection, the boron ions in $p^+$ type polysilicon (gate electrode) diffuse into the semiconductor substrate (particularly into a channel region), which causes a problem of a low reliability of a transistor.

SUMMARY OF THE INVENTION

Accordingly, the present invention is directed to a method for an oxide film in a semiconductor device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming an oxide film in a semiconductor device includes the steps of providing a semiconductor substrate, forming an insulating film on the semiconductor substrate, injecting first, and second impurity ions into the semiconductor substrate through the exposed insulating film after masking required regions of the insulating film, removing the insulating film, and forming first, and second oxide films having thicknesses different from each other on regions of the semiconductor substrate having the impurity ions are injected and the impurity ions are not injected thereto, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 2a~2e illustrate sections showing process steps of a method for forming an oxide film in a semiconductor device in accordance with a first embodiment of the present invention.

Figure 1A:
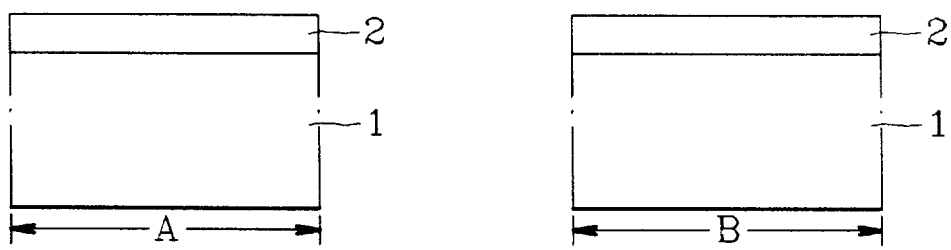
FIGS. 1a~1e illustrate sections showing process steps of a background art method for forming an oxide film in a semiconductor device.
Figure 1B:
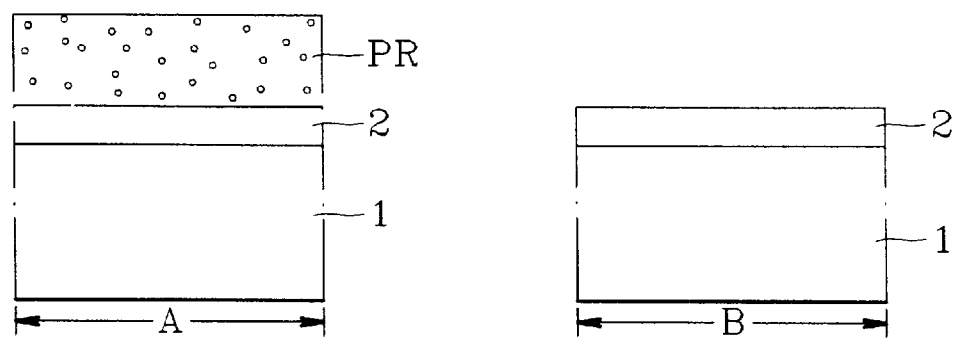
Figure 1C:
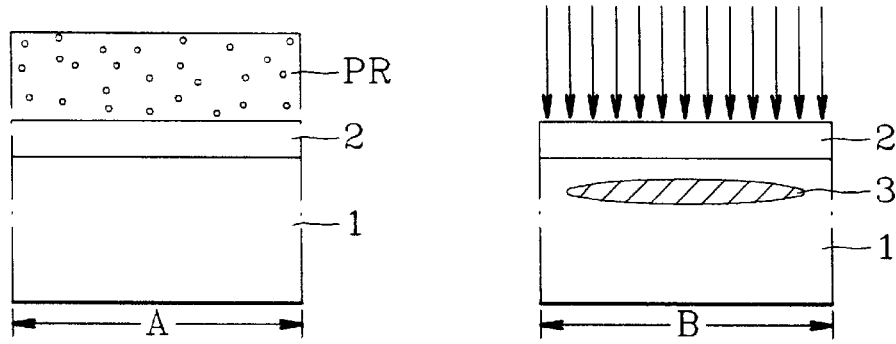
Figure 1D:
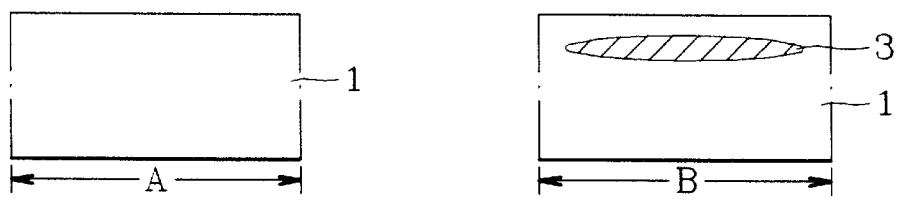
Figure 1E:
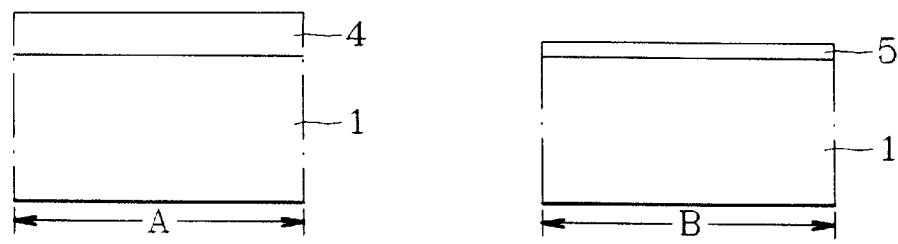
Figure 2A:
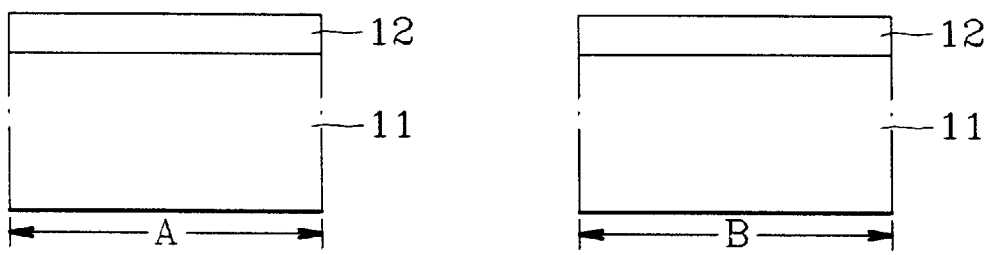
FIGS. 2a~2e illustrate sections showing process steps of a method for forming an oxide film in a semiconductor device in accordance with a first embodiment of the present invention; and, FIGS. 3a~3f illustrate sections showing process steps of a method for forming an oxide film in a semiconductor device in accordance with a second embodiment of the present invention.
Figure 2B:
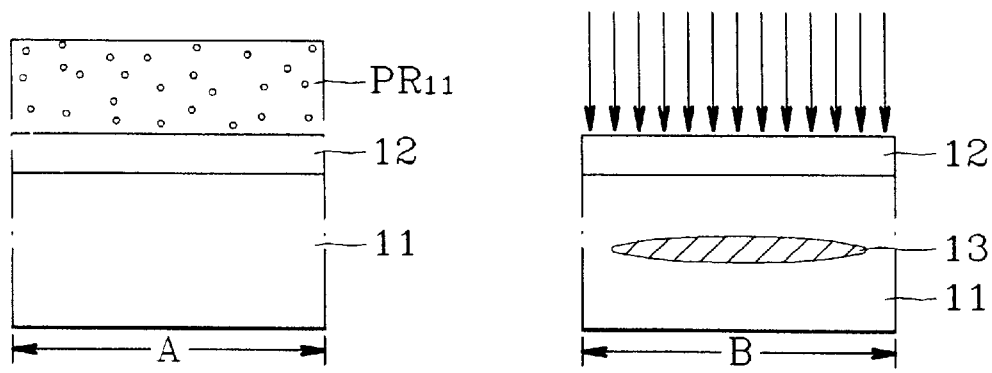
Figure 2C:
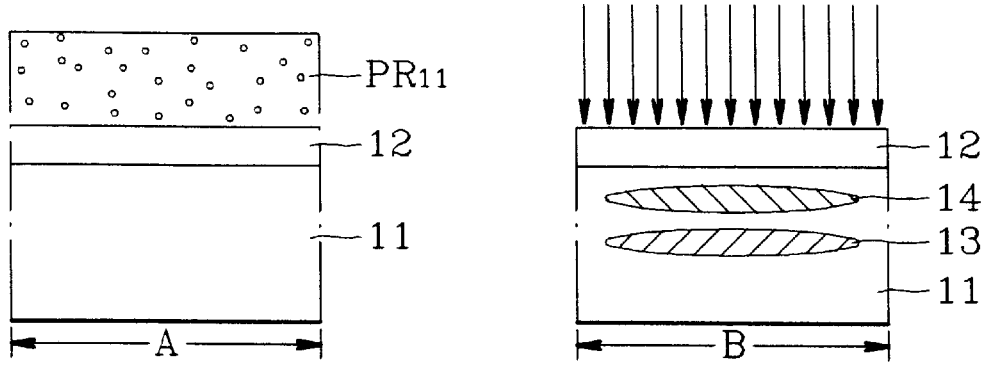
Figure 2D:
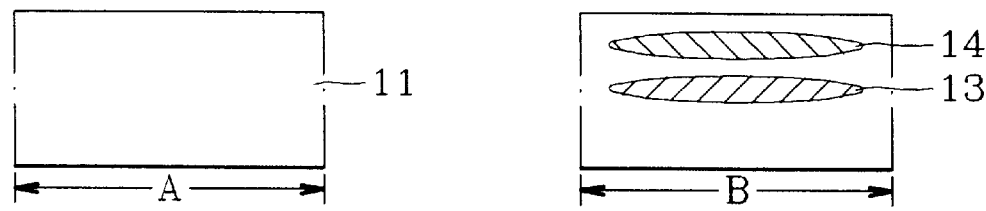
Figure 2E:
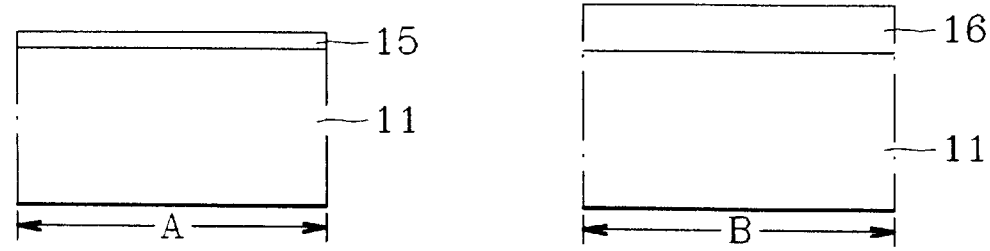

Referring to FIG. 2a, an insulating film 12 is formed on regions of a semiconductor substrate 11 defined as a first region A a thin oxide film to be formed thereon and a second region B a thick oxide film to be formed thereon to a thickness of 50~500 Å, by, preferably, growing the semiconductor substrate 11. As shown in FIG. 2b, a photoresist film $PR_{11}$ is formed on the insulating film 12 and subjected to patterning by exposure and development, to leave the photoresist film $PR_{11}$ only on a region of the semiconductor substrate 11 defined as the first region A. Nitrogen ions 13 are injected into a region of the semiconductor substrate 11 defined as the second region B using the patterned photoresist film $PR_{11}$ as a mask at an injection energy of 10~50 KeV with a dose of $3 \times 10^{13} \sim 5 \times 10^{15}$ cm$^{-2}$. As shown in FIG. 2c, fluorine ions 14 are injected into the second region B using the photoresist $PR_{11}$ as a mask at an injection energy of 10~50 KeV with a dose of $3 \times 10^{13} \sim 5 \times 10^{15}$ cm$^{-2}$. Then, the semiconductor substrate is annealed to diffuse the nitrogen and fluorine ions 13 and 14. In this instance, the fluorine, and nitrogen ions 14 and 13 are injected at projection ranges (Rp) different from each other; the nitrogen ions 13 has a projection range deeper than the fluorine ions 14. As shown in FIG. 2d, the semiconductor substrate 11 is annealed to diffuse the nitrogen, and fluorine ions 13 and 14, and, then, the photoresist film PR11 and the insulating film 12 are removed. The annealing is may conducted in a rapid thermal annealing at 800~1000° C. for 5~30 seconds or in a furnace at 700~950° C. for 10~60 minutes. In the annealing, defects and damages to the substrate caused by the ion injections are cured. As shown in FIG. 2e, a thin first gate oxide film 15 is grown on the first region A to a thickness ranging 40~60 Å and a thick second oxide film 16 is grown on the second region B to a thickness ranging 60~150 Å.

FIGS. 3a~3f illustrate sections showing process steps of a method for forming an oxide film in a semiconductor device in accordance with a second embodiment of the present invention.

Figure 3A:
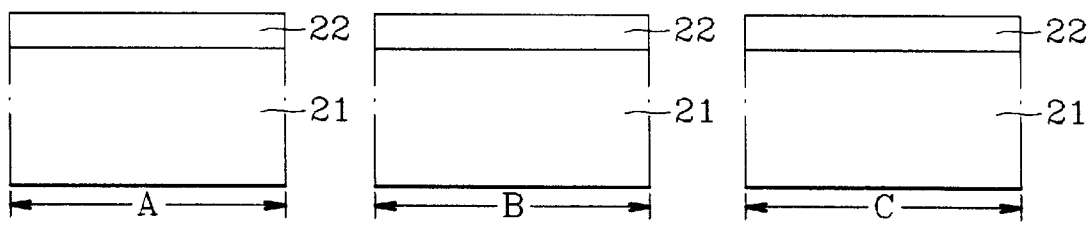
Figure 3B:
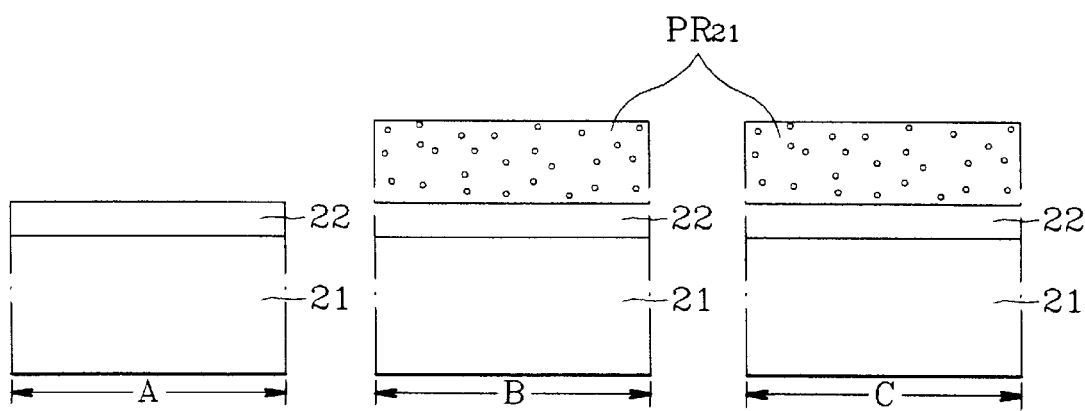
Figure 3C:
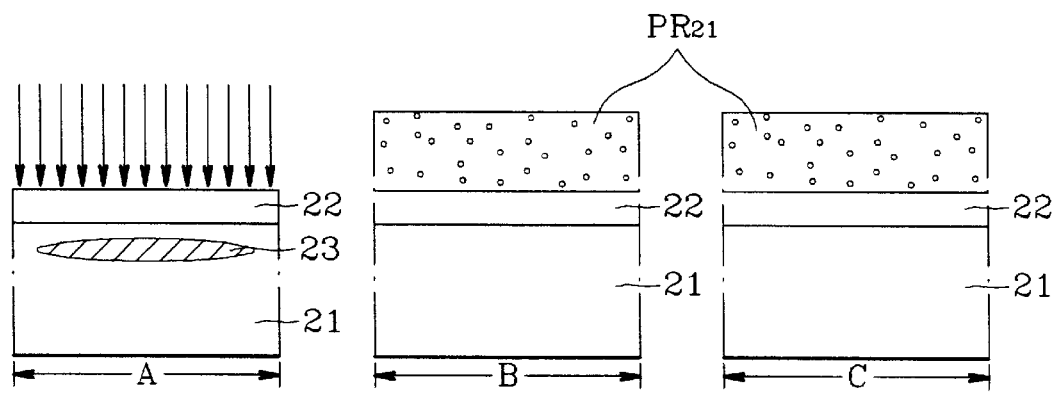
Figure 3D:
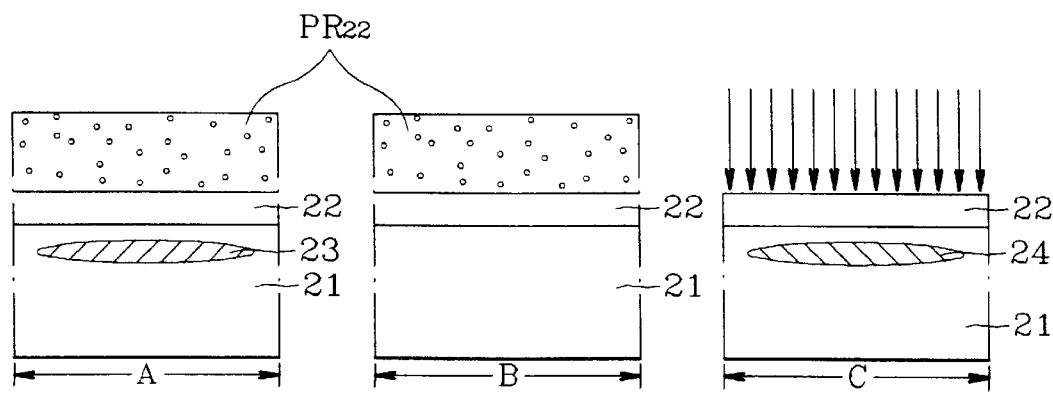
Figure 3E:
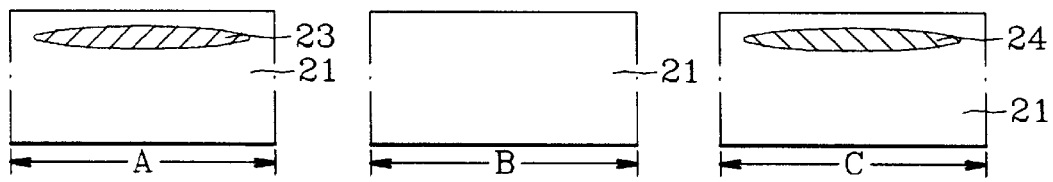
Figure 3F:
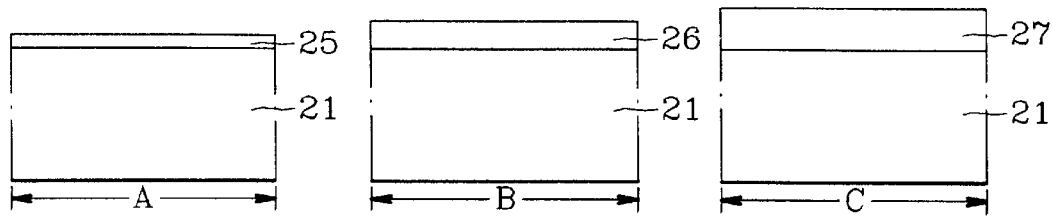

Referring to FIG. 3a, an insulating film 22 is formed on regions of a semiconductor substrate 21 defined as first, second and third regions A, B and C oxide films of different thicknesses to be formed thereon, to a thickness ranging 50~500 Å by, preferably, growing the semiconductor substrate 21. The second region B is a region on which a gate oxide film thicker than the oxide film to be formed on the first region A is to be formed, and the third region C is a region on which a gate oxide film thicker than the oxide film to be formed on the second region B is to be formed. As shown in FIG. 3b, a photoresist film $PR_{21}$ is formed on the insulating film 22 and subjected to patterning by exposure and development, to remove the photoresist film $PR_{21}$ on the first region A of the semiconductor substrate 21. As shown in FIG. 3c, nitrogen ions 23 are injected into the first region A of the semiconductor substrate 21 using the patterned photoresist film $PR_{21}$ as a mask at an injection energy of 10~50 KeV with a dose ranging $3 \times 10^{13} \sim 5 \times 10^{15}$ cm$^{-2}$. As shown in FIG. 3d, the photoresist film $PR_{21}$ is removed. Then, a photoresist film $PR_{22}$ is formed on an entire surface of the insulting film 22 and subjected to patterning by exposure and development, to remove the photoresist film $PR_{22}$ on the third region C. Fluorine ions 24 are injected into the third regions C of the semiconductor substrate 21 using the patterned photoresist film $PR_{22}$ as a mask, at an injection energy of 10~50 KeV with a dose ranging $3 \times 10^{13} \sim 5 \times 10^{15}$ cm$^{-2}$. The semiconductor substrate 21 is annealed to diffuse the nitrogen, and fluorine ions 23 and 24. Then, the insulating film 22 and the photoresist film $PR_{22}$ are removed. In this instance, the diffusion may be carried out after removal of the insulating film 22 and the photoresist film $PR_{22}$. The annealing may be a rapid thermal annealing at 800~1000° C. for 5~30 seconds or conducted in a furnace at 700~950° C. for 10~60 minutes. As shown in FIG. 3e, a first oxide film 25 is formed on the first region A, which is the thinnest of the oxide films formed on the three regions A, B and C, a second oxide film 26 of medium thickness is formed on the second region B, and a third oxide film 27 is formed on the third region C, which is the thickest of the oxide films formed on the three regions A, B and C; a triple gate oxide film is formed. The first gate oxide film 25 on the first region A has a thickness ranging 40~70 Å, the second gate oxide film 26 has a thickness ranging 50~90 Å, and the third gate oxide film 27 on the third region B has a thickness ranging 70~150 Å.

Meanwhile, a memory cell and the like, which is operable at a low voltage, may be formed on the first gate oxide film 25 which is the thinnest, a DRAM core/peripheral may be formed on the second gate oxide film 26 of medium thickness, and an ESD part and input/output parts may be formed on the third gate oxide film 27 which is the thickest.

The method for forming an oxide film in a semiconductor device of the present invention has the following advantages.

First, when nitrogen and fluorine ions are injected into a semiconductor substrate with projection ranges different from each other before formation of a dual gate oxide film, the nitrogen ions prevent boron ion diffusion from a doped polysilicon layer used as a gate electrode into the substrate and the fluorine ions causes the gate oxide film formed thicker with an improvement of a TDDB, the method for forming a dual gate oxide film in accordance with a first embodiment of the present invention allows to provide a semiconductor device of a high reliability.

Second, in a device such as a embedded DRAM in which a DRAM and a logic element is combined, as voltages different from one another are allowed to apply by dividing a high voltage region (ESD, input/output parts), a medium voltage region (memory cell array) and a low voltage region (logic part and core/peripheral regions), with an increased selectivity of device and circuit, allowing an operation of the semiconductor device matched to an optimal condition, the method for forming a triple gate oxide film in accordance with a second embodiment of the present invention allows to provide a semiconductor device of a high reliability.

It will be apparent to those skilled in the art that various modifications and variations can be made in the method for forming an oxide film in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming an oxide film in a semiconductor device, comprising:

providing a semiconductor substrate;

forming an insulating film on the semiconductor substrate;

injecting first, and second impurity ions into the semiconductor substrate through the exposed insulating film after masking required regions of the insulating film wherein the first impurity ions comprise nitrogen ions and the second impurity ions comprise fluorine ions;

removing the insulating film; and, forming first, and second oxide films having thicknesses different from each other on regions of the semiconductor substrate having the impurity ions are injected and the impurity ions are not injected thereto, respectively.

2. A method as claimed in claim 1, wherein the insulating film is an oxide film.

3. A method as claimed in claim 2, wherein the oxide film has a thickness of 50~500 Å.

4. A method as claimed in claim 1, wherein the nitrogen, and fluorine ions have projection ranges different from each other.

5. A method as claimed in claim 4, wherein the nitrogen ions are projected to a depth deeper than the fluorine ions.

6. A method as claimed in claim 5, wherein the fluorine, and nitrogen ions are injected at an energy of 10~50 KeV.

7. A method as claimed in claim 6, wherein a dose in the fluorine, and nitrogen ion injection ranges $3\times10^{13}$~$5\times10^{15}$ cm$^{-2}$.

8. A method as claimed in claim 1, wherein the semiconductor substrate is annealed after the first, and second impurity ion injection.

9. A method as claimed in claim 8, wherein the annealing may be a rapid thermal annealing at 800~1000° C. for 5~30 seconds.

10. A method as claimed in claim 8, wherein the annealing may be carried out in a furnace at 700~950° C. for 10~60 minutes.

11. A method as claimed in claim 1, wherein the first oxide film formed on the region to which the impurity ions are injected has a thickness thicker than the second oxide film formed on the region to which the impurity ions are not injected.

12. A method as claimed in claim 1, wherein the first oxide film has a thickness of 60~150 Å, and the second oxide film has a thickness of 40~80 Å.

13. A method for forming an oxide film in a semiconductor device, comprising:

providing a semiconductor substrate;

defining first, second and third regions of the semiconductor substrate;

forming an insulating film on the semiconductor substrate;

selectively masking the second, and third regions of the insulating film;

injecting first nitrogen impurity ions into the first region of the semiconductor substrate through the insulating film;

selectively masking the first, and second regions of the insulating film;

injecting second impurity ions into the third region of the semiconductor substrate through the insulating film;

removing the insulating film; and, forming first, second and third oxide films having thicknesses different from one another on the first, second and third regions of the semiconductor substrate, respectively.

14. A method as claimed in claim 13, wherein the second impurity ion is fluorine ion.

15. A method as claimed in claim 13, wherein the third oxide film has a thickness thicker than the second oxide film, and the second oxide film has a thickness thicker than the first oxide film.

16. A method as claimed in claim 13, wherein the first oxide film has a thickness of 40~70 Å, the second oxide film has a thickness of 50~90 Å, and the third oxide film has a thickness of 70~150 Å.

17. A method for forming an oxide film in a semiconductor device, comprising:

providing a semiconductor substrate;

defining first, second and third regions of the semiconductor substrate;

forming an insulating film on the semiconductor substrate;

selectively masking the second, and third regions of the insulating film;

injecting first impurity ions into the first region of the semiconductor substrate through the insulating film;

selectively masking the first, and second regions of the insulating film;

injecting second fluorine impurity ions into the third region of the semiconductor substrate through the insulating film;

removing the insulating film; and, forming first, second and third oxide films having thicknesses different from one another on the first, second and third regions of the semiconductor substrate, respectively.

18. A method as claimed in claim 17, wherein the third oxide film has a thickness thicker than the second oxide film, and the second oxide film has a thickness thicker than the first oxide film.

19. A method as claimed in claim 17, wherein the first oxide film has a thickness of 40~70 Å, the second oxide film has a thickness of 50~90 Å, and the third oxide film has a thickness of 70~150 Å.

* * * * *